(12) United States Patent
Jain

(10) Patent No.: US 6,717,650 B2
(45) Date of Patent: Apr. 6, 2004

(54) MASKLESS LITHOGRAPHY WITH SUB-PIXEL RESOLUTION

(75) Inventor: Kanti Jain, Hawthorne, NY (US)

(73) Assignee: Anvik Corporation, Hawthorne, NY (US)

(*) Notice: Subject to any disclaimer, the term of this patent is extended or adjusted under 35 U.S.C. 154(b) by 65 days.

(21) Appl. No.: 10/137,086

(22) Filed: May 1, 2002

(65) Prior Publication Data

US 2003/0206281 A1 Nov. 6, 2003

(51) Int. Cl.[7] .................. G03B 27/42; G03B 27/54; G03B 27/72
(52) U.S. Cl. ............ 355/53; 355/67; 355/71
(58) Field of Search .................. 355/53, 67, 71

(56) References Cited

U.S. PATENT DOCUMENTS

| | | | | |
|---|---|---|---|---|
| 5,523,193 A | * | 6/1996 | Nelson | 430/311 |
| 5,691,541 A | * | 11/1997 | Ceglio et al. | 250/492.1 |
| 5,870,176 A | * | 2/1999 | Sweatt et al. | 355/53 |
| 6,473,237 B2 | * | 10/2002 | Mei | 359/619 |
| 2002/0171816 A1 | * | 11/2002 | Markle | 355/67 |

* cited by examiner

Primary Examiner—Rodney Fuller
(74) Attorney, Agent, or Firm—Carl C. Kling (57) ABSTRACT

Maskless microlithography provides a sub-pixel voting system using multiple, slightly-offset, digitally-controlled, unit-pixel, partial exposures with cumulative voting to identify regions of full exposure for sub-pixel-selection. Computer control of a virtual-mask pixel-selection device of unit-pixel resolution usually provides pixel-resolution patterns. To achieve sub-pixel resolution, the virtual mask, after a first partial exposure, is offset by less than a pixel-width and a second partial exposure is made. If the offset is ½ pixel-width, the result is a half-pixel size image region of full exposure. Finer voting can be defined by number of pulses, by significantly changing the offset, by offset in another dimension, and by increasing the multiplicity of exposures, thus enabling resolution enhancement by large multiples. The offsetting techniques can also be used to drill controlled-depth vias or to provide topography controls for laser-milling.

12 Claims, 13 Drawing Sheets

MASKLESS LITHOGRAPHY WITH SUB-PIXEL RESOLUTION

BACKGROUND OF THE INVENTION

1. Field of the Invention

This invention relates to microlithography, and more particularly relates to maskless lithography techniques capable of providing sub-pixel resolution from a unit-pixel spatial light modulator used as a pixel-selection device in a virtual mask system.

Figure 1:
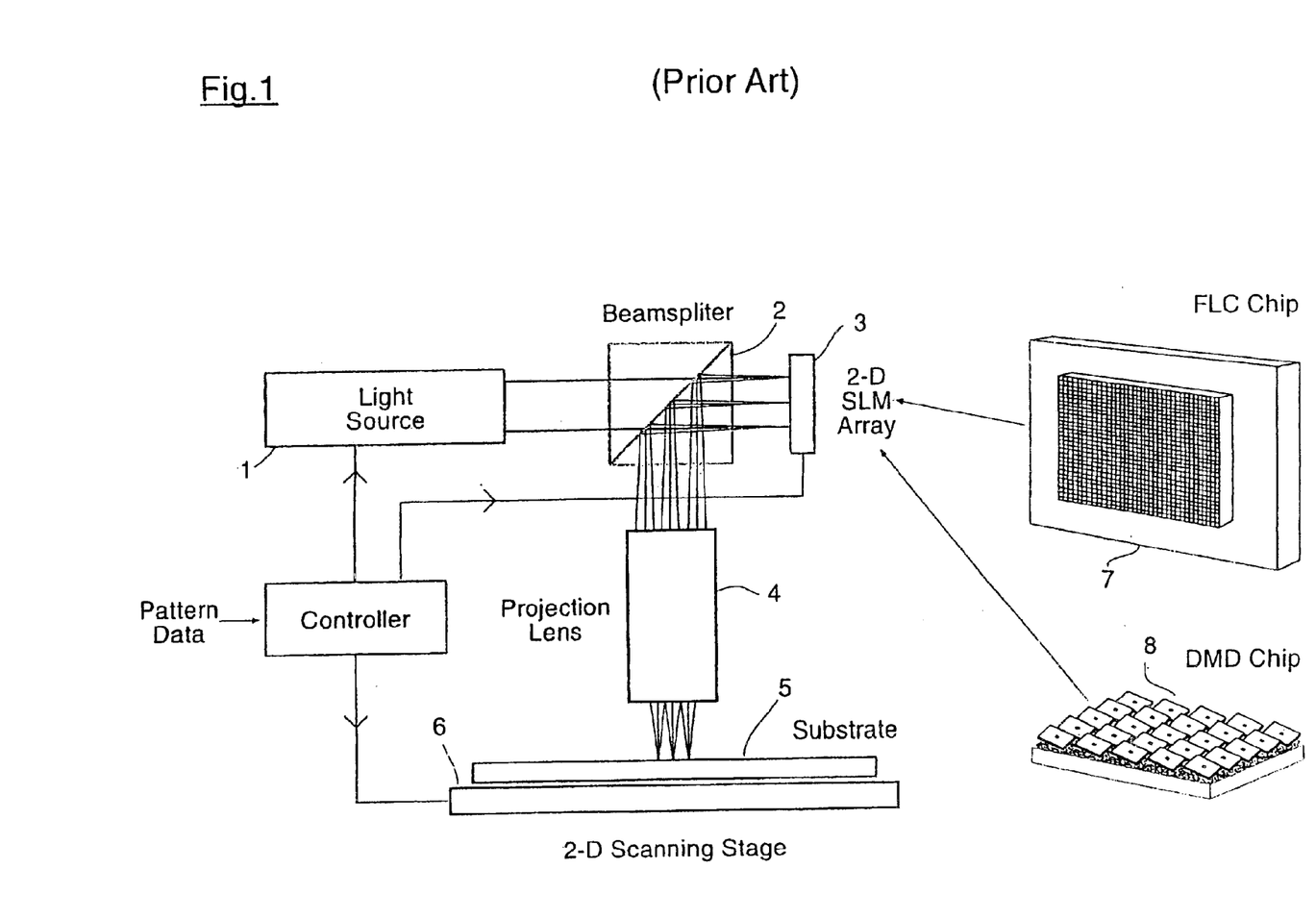
FIG. 1 (Prior Art) is a schematic view of a maskless microlithography system in use.
Figure 2:
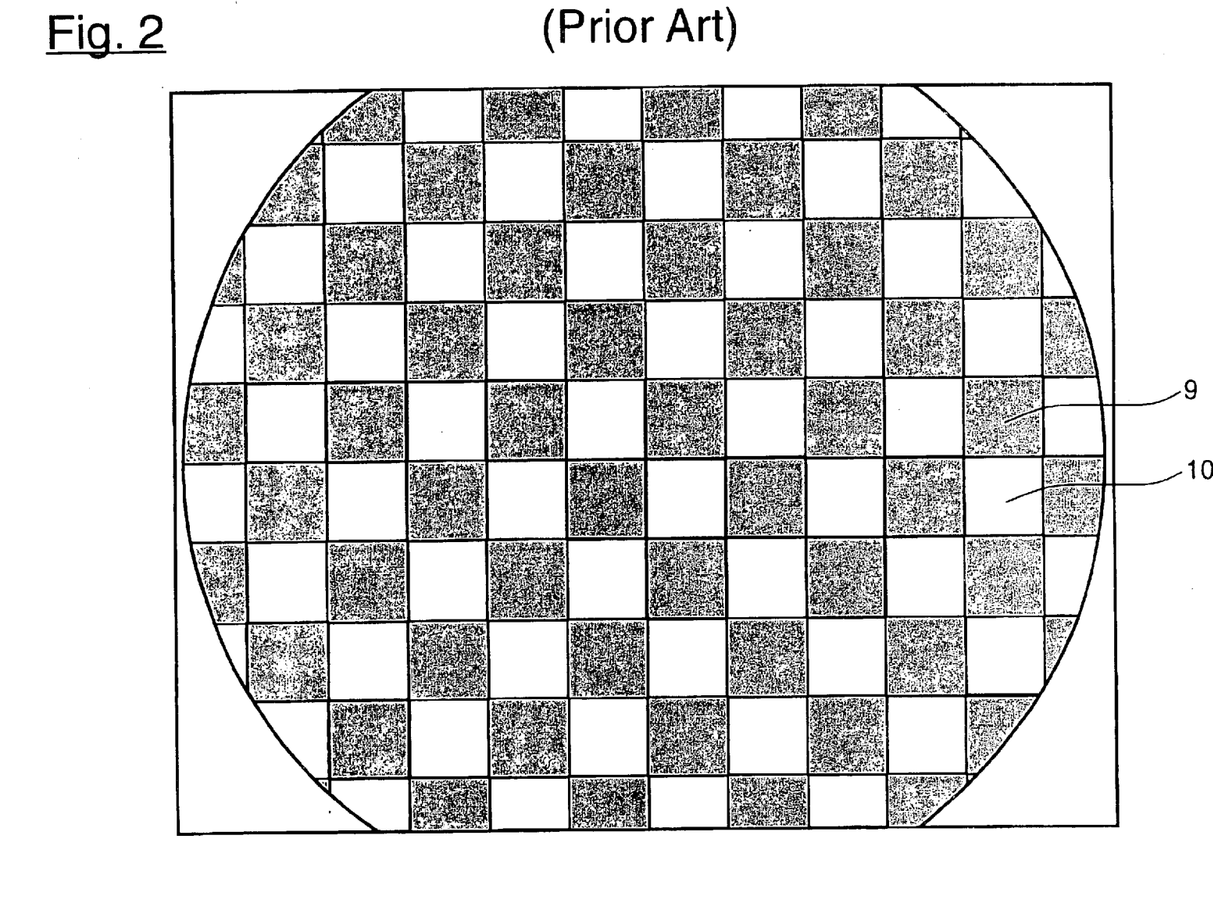
FIG. 2 (Prior Art) is a photomicrograph of a checkerboard pattern of exposure made with the system of FIG. 1.

In our previous patent applications, we have described a maskless lithography technology using a spatial light modulator (SLM) array coupled with an imaging system and an x-y scanning stage, as shown in prior art FIG. 1. The SLM is a 2-D array of light modulators (digital micromirrors, liquid-crystal cells, etc.) each of which is programmable independently. The SLM array is illuminated by a broad-area laser beam and the hundreds of thousands of reflected beams (when the SLM elements are micromirrors) are imaged by a projection lens onto a photoresist-coated substrate mounted on a scanning stage. By programming the micromirrors with the pattern information from a Computer-Aided-Design (CAD) file, the desired image is exposed on the substrate (FIG. 2).

The above technique is further combined with an x-y scanning stage (also prior art) such as is described in FIG. 1. As the stage 6 scans, a slightly-offset different region of the substrate is illuminated by beams coming from the SLM array 3 through the projection lens 4. The pattern needed for exposure of this slightly different substrate region may be different, and is properly provided by making small changes in the pattern information fed to the SLM 3. The small changes to the information fed to the SLM 3 can be done at fast frame rates (>1 kHz), thereby accommodating scanning of the stage 6 at good speeds, thus enabling high throughputs.

A limitation of prior-art techniques is that the achievable resolution of the lithography system is limited by the single-pixel element of the spatial light modulator. For example, the typical minimum dimension (length or width) of a micromirror element is approximately 15 $\mu$m. If the projection lens has a reduction ratio of 5:1, the pixel-width on the substrate (which I shall call the image resolution of the lithography system) will be:

15 $\mu$m/5=3 $\mu$m.

Assuming the highest-density pixel-selection unit, the image resolution of the system can be improved only by using a projection lens of higher and higher reduction ratio. For example, a 10:1 projection lens will produce a resolution of 1.5 $\mu$m, and a 50:1 lens will make it possible to achieve a resolution 300 nm. Nevertheless, the fundamental limit of resolution, R, is given by:

$$R = d_p / M_r \qquad \text{Equation (1)}$$

where $d_p$ is the size (length or width) of a pixel and $M_r$ the reduction ratio of the projection lens, and this optical limitation cannot be overcome. This patent application, however, describes an invention that enables maskless imaging with significantly higher resolution than described by the above optical limitation, using the characteristic exposure values of the photoresist or substrate proper and a cumulative, partially overlapping voting technique with repeated sub-threshold exposures by virtual-mask offsets to select individual sub-pixel regions.

2. Description of Related Art

It is not an easy solution to achieve imaging resolution finer than the pixel size of the device as projected by the projection lens in a maskless microlithography system. The virtual mask typically is a computer-selected spatial light modulator which provides the pattern by selection and non-selection of individual pixel-selection elements. In a maskless system using a digital micromirror device as the pixel-selection device, an individual micromirror element is computer-selected (on or off) for a black or white spot typically having the same dimensions as a DMD micromirror element (1:1 projection), or a larger dimension if a magnification lens is used, or, in the best case, a smaller size if a reduction projection lens is used. A resolution improvement solution, if it is to be achieved at all, requires a finer-resolution pixel-selection device, assuming no change in the high-reduction-ratio projection lens.

SUMMARY OF THE INVENTION

It is the object of the invention to provide a novel lithography technique of maskless, seamless, small-field large-area scanning with sub-pixel resolution achieved through sub-threshold voting exposures.

Another object of the invention is to control scanning motion and laser pulses to provide sub-threshold pixel overlap capable of cumulative fractional-selection of selected sub-pixel areas with voting to achieve proper exposure with sub-pixel-selection for patterning.

Still another object of the invention is to provide greater-than-binary sub-pixel attributes by sub-pixel exposure to a variety of depths.

A feature of the invention is the use of exposure voting of cumulative, multiple, fractional-selection, sub-threshold exposures to achieve to sub-pixel image areas.

An advantage of the invention is that it eliminates the fundamental resolution limitation of lithography systems that is dictated by the pixel element size of the spatial light modulator.

Another advantage of the invention is that it may be implemented onto existing systems through computer control of sub-pixel-size overlaps.

Other objects, features and advantages of the invention will be apparent from the following written description, claims, abstract and the annexed drawings.

OVERVIEW OF THE INVENTION

Sub-pixel digital resolution is provided in a maskless microlithography system by an exposure voting system using cumulative partial exposures for selection after multiple, slightly-offset, sub-threshold, digitally-controlled unit-pixel exposures with cumulative voting identifying regions of proper exposure for sub-pixel image selection. Computer control of a virtual-mask pixel-selection device of unit-pixel resolution would usually provide pixel-resolution patterns. To achieve sub-pixel resolution, the virtual mask, after a first sub-threshold exposure, is offset by a fraction of a pixel-width, and a second sub-threshold exposure is made. If the offset is ½ pixel-width, then there is a possible half-pixel region of two exposures. Voting by two-exposure selection, there is a half-size sub-pixel selected for full exposure for development. Smaller-fraction voting can be defined by the number of pulses, by significantly changing the offset, by offset in another dimension, and by increasing the multiplicity of exposures. The same offsetting techniques can be used for other than binary voting, for example to photo-etch controlled-depth vias or to provide topography controls for laser-milling a controlled microsurface.

DESCRIPTION OF THE PREFERRED EMBODIMENT

Prior art FIG. 1 shows how a light source 1, beamsplitter 2 and 2-D spatial light modulator 3 can provide a virtual-mask pattern, such as the checkerboard pattern of Prior Art FIG. 2, via projection lens 4 to substrate 5. A 2-D scanning stage 6 carries the substrate 5 about in a scanning motion. Typical 2-D SLM arrays are Ferroelectric Liquid Crystal (FLC) 7 and Digital Micromirror Device (DMD) 8. Other 2-D SLM arrays may include a grating light valve or a membrane mirror array.

FIG. 2 shows selected pixels 9 and non-selected pixels 10.

Figure 3:
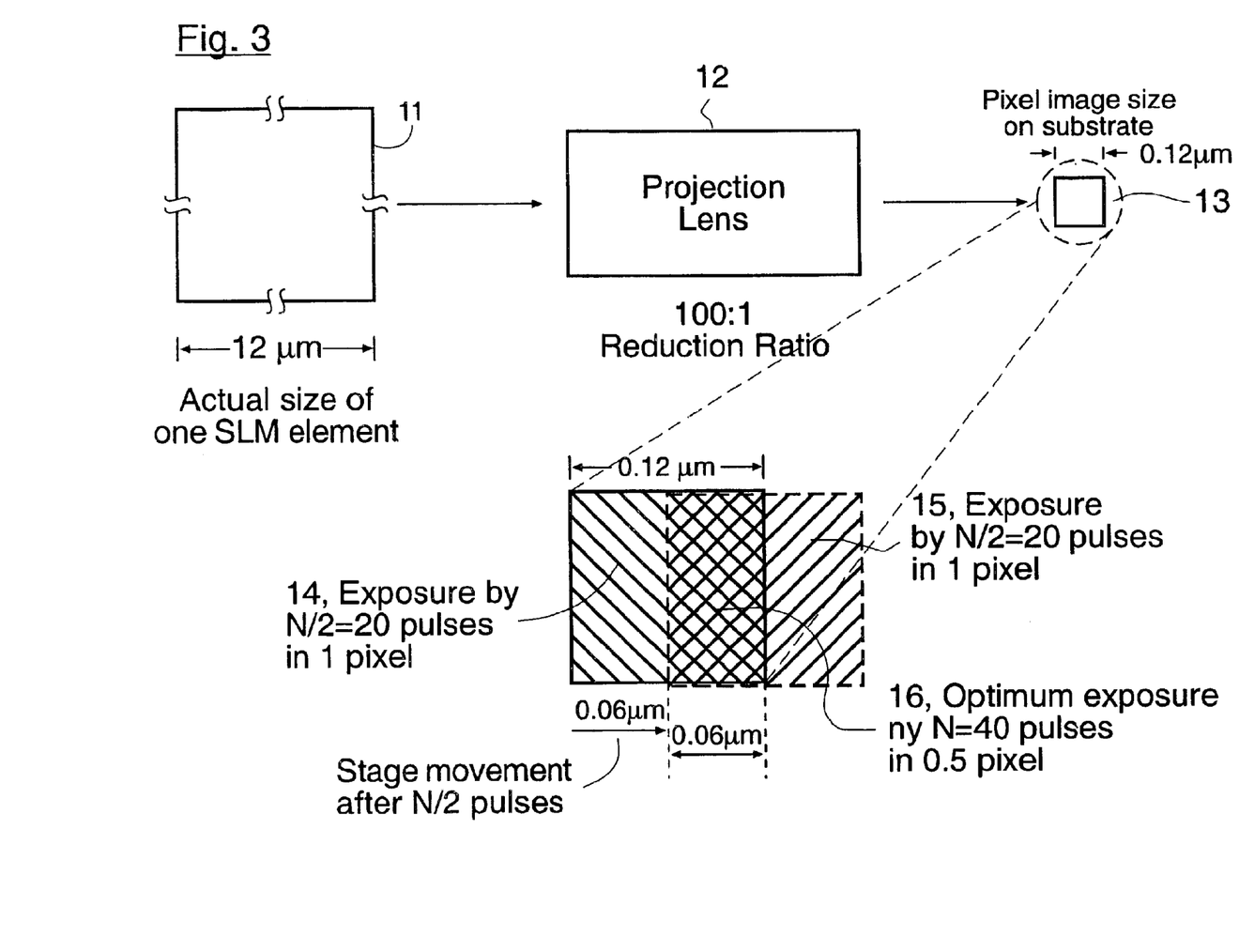
FIG. 3 is an illustration of exposure relationships showing how voting of multiple overlapping partial exposures can result in a fully exposed area of sub-pixel size.

FIG. 3 shows how a projection lens with a reduction rate of 100:1 can be used for a pixel-image size on the substrate of 1/10,000 the unit pixel-area of the pixel-selection device, for example an individual digital micromirror. The figure also shows two pixel-size partial exposures offset by ½ pixel width, producing optimum exposure in a region of ½ pixel width.

Figure 4:
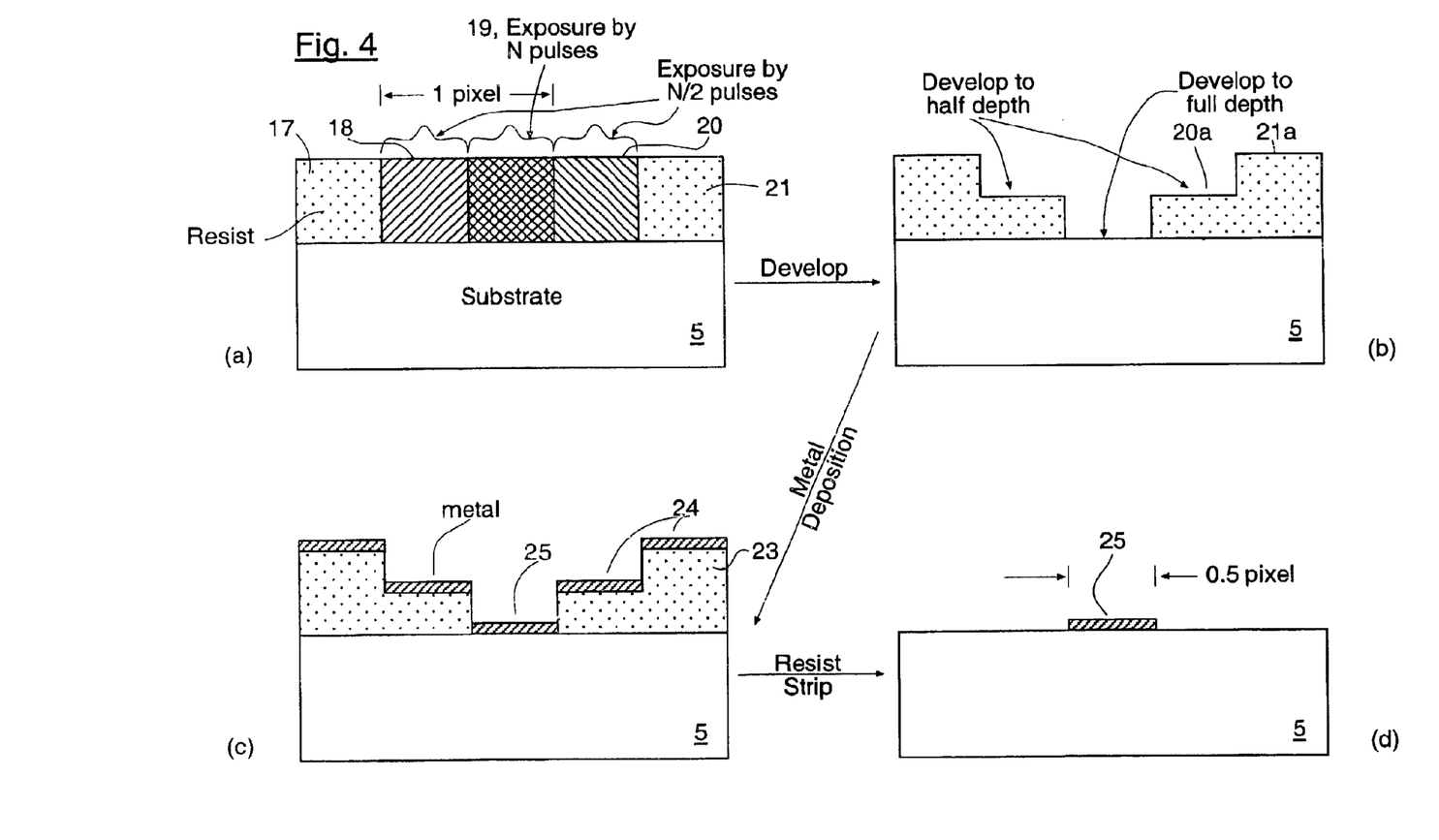
FIG. 4 shows how voting selection of a small multiple-exposed sub-pixel area in photoresist can be further processed to result in a sub-pixel-size metallization region.
Figure 5:
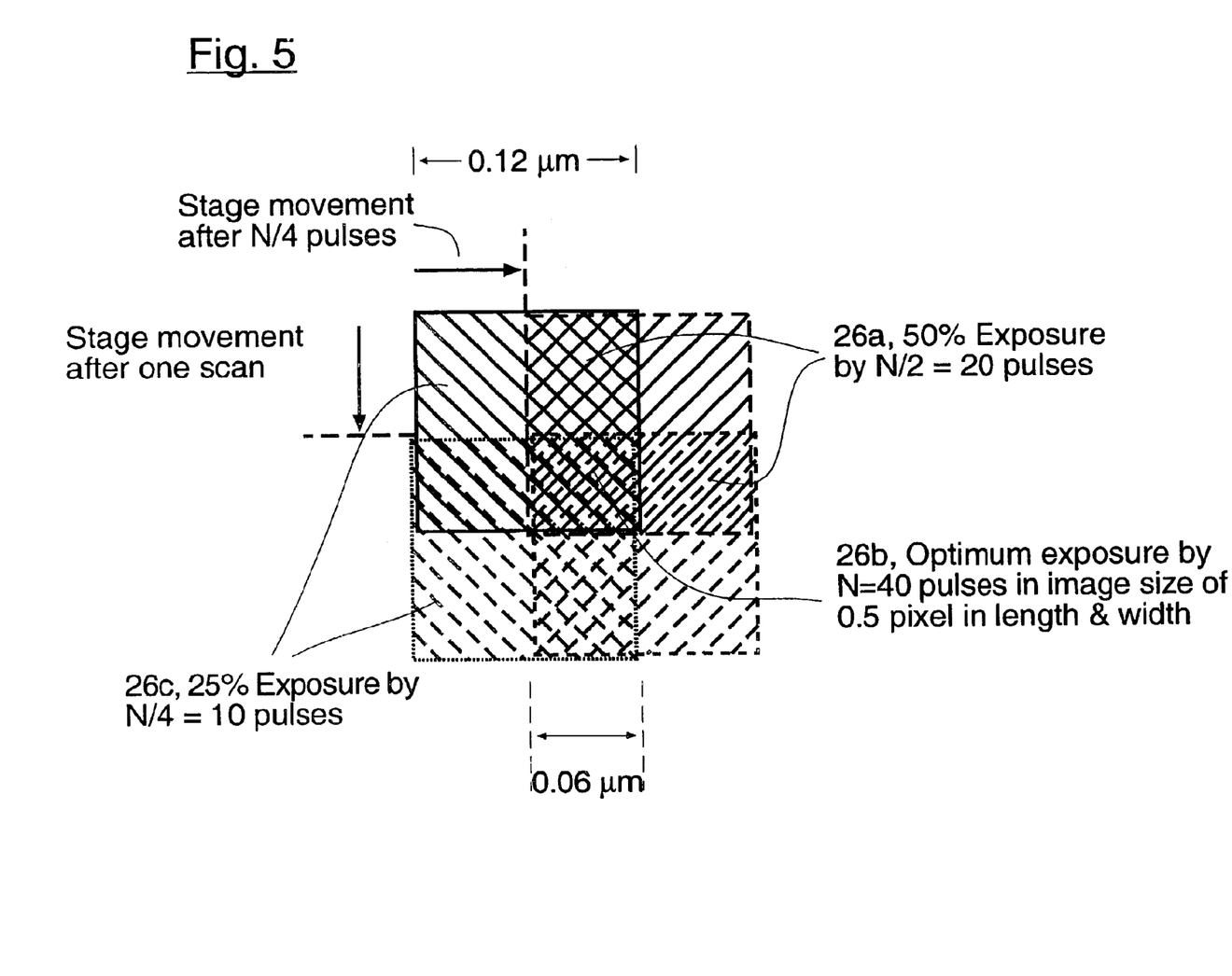
FIG. 5 is an illustration showing how multiple exposures offset by ½ pixel-width affect a pixel-size area to produce a ¼ pixel area pattern with ½ pixel-width per side.
Figure 6:
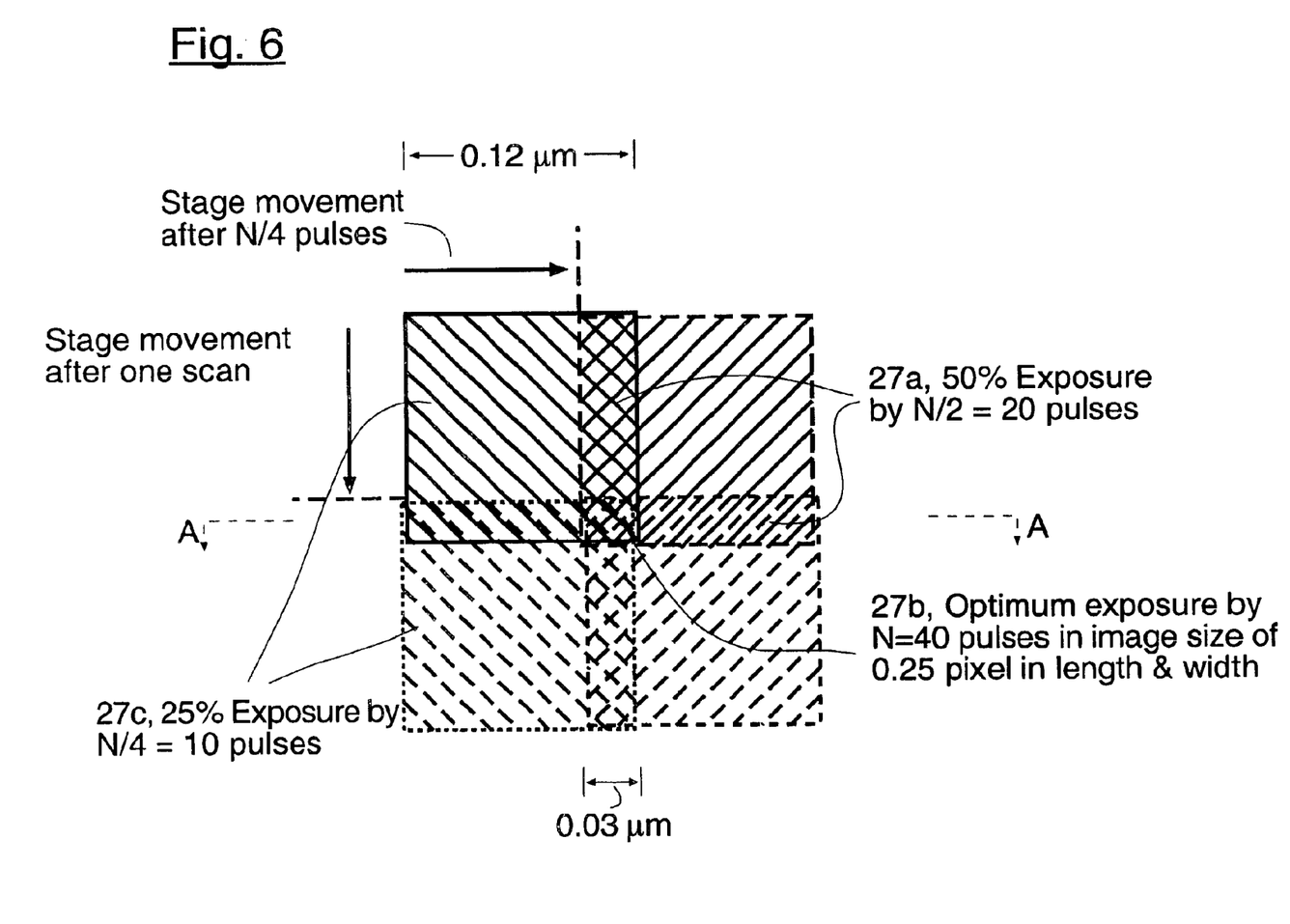
FIG. 6 shows how multiple exposures offset by ¾ pixel-width affect a pixel-size area to produce a ¹⁄₁₆ pixel area pattern with ¼ pixel-width per side.
Figure 7:
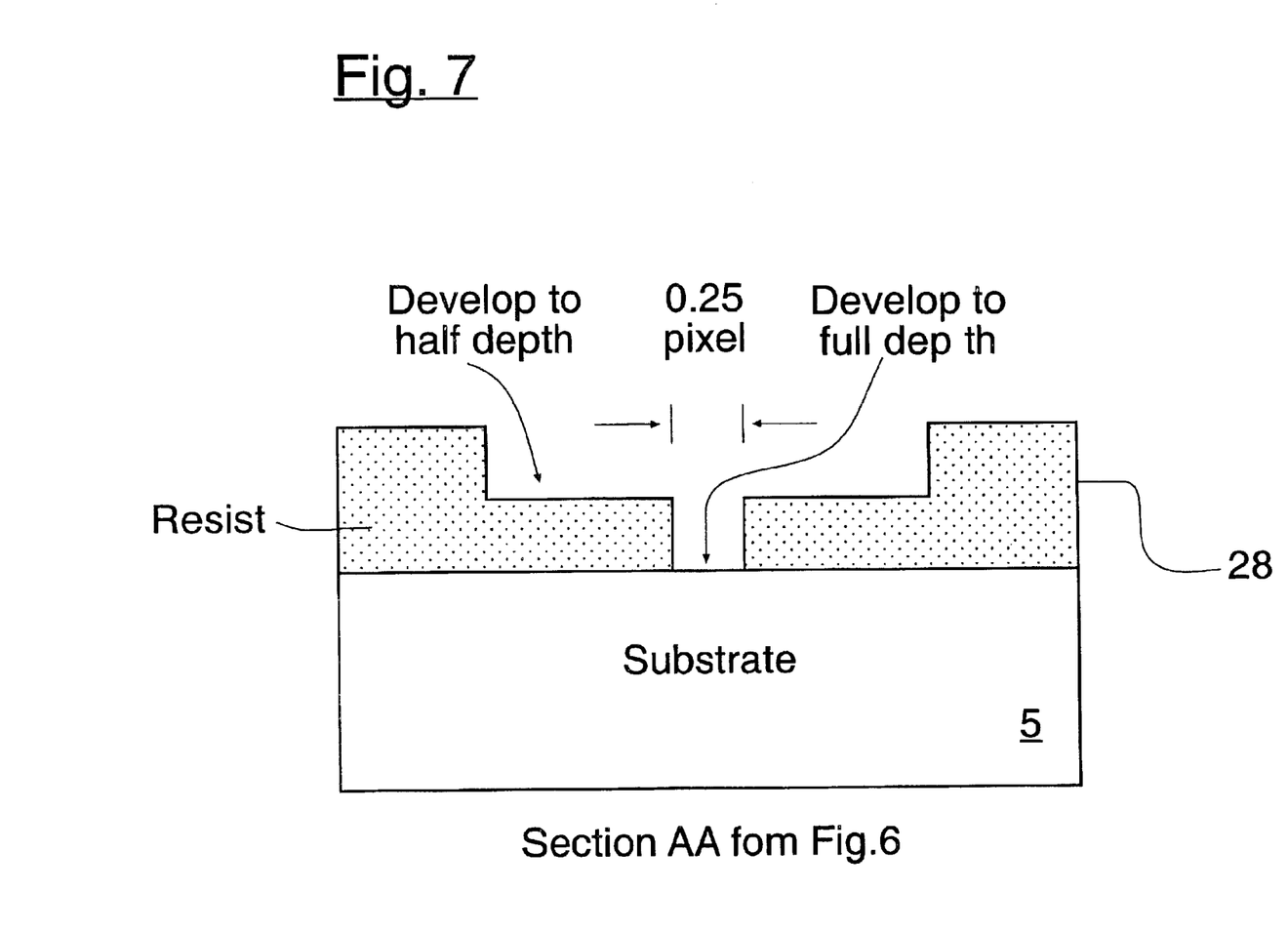
FIG. 7 is a sectional view of the substrate of FIG. 6, showing a ¼-pixel-size pattern in developed resist.

FIG. 4 shows the cumulative result of voting of two partial exposures used for sub-pixel-selection FIGS. 5, 6 and 7 show how voting of four partial exposures offset in two dimensions and subsequent developing can result in sub-pixel (½ pixel) resolution.

Figure 8:
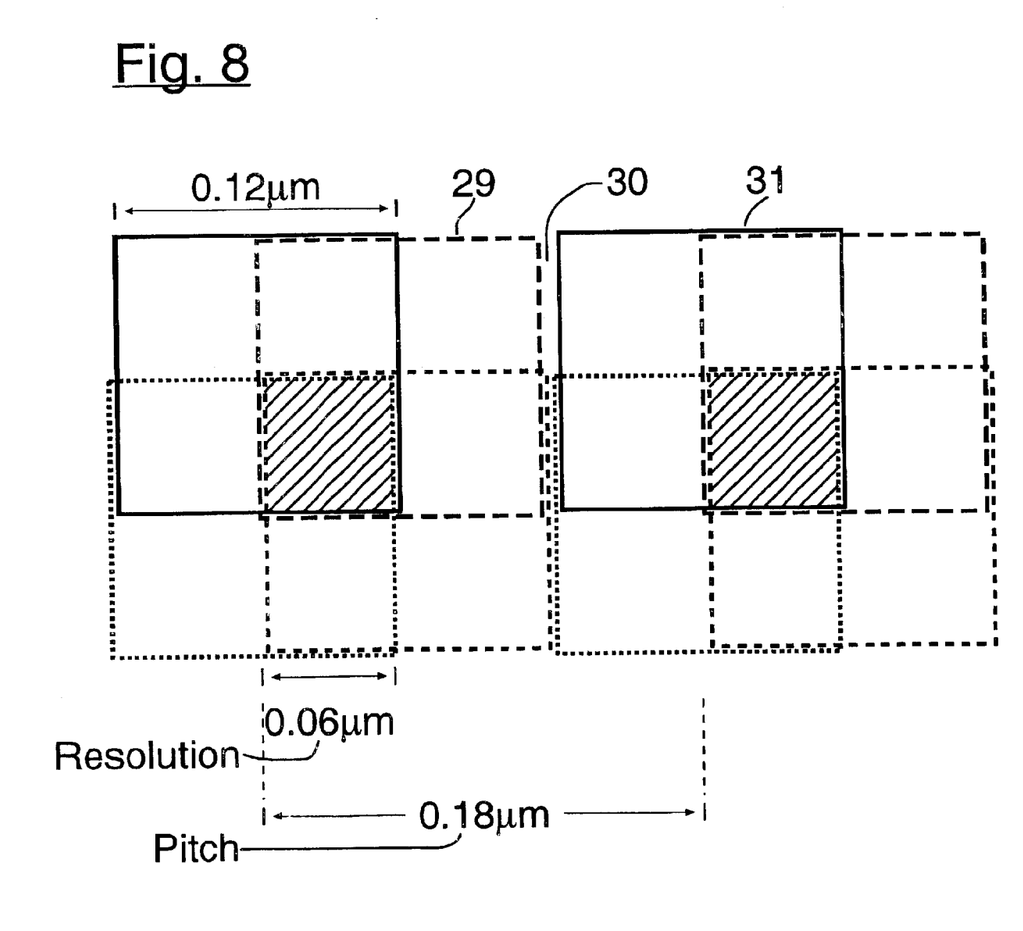
FIG. 8 is a plan view illustrating the limitation on the pitch at a half-pixel-width resolution.
Figure 9:
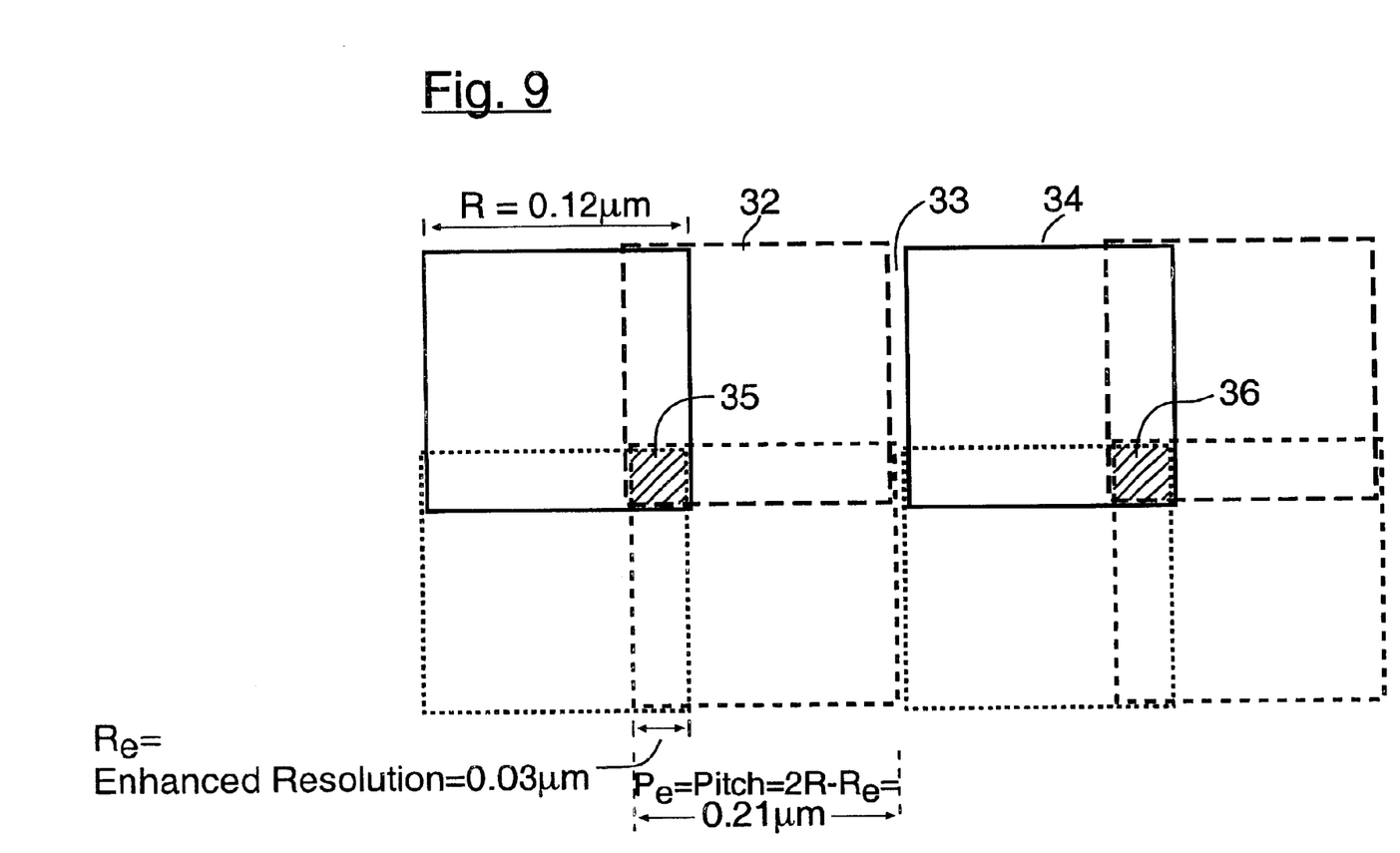
FIG. 9 is a plan view illustrating the limitation on the pitch at a quarter-pixel-width resolution.

FIGS. 8 and 9 show relationships of resolution and pitch of sub-pixel images.

FIGS. 10–13 show how sub-pixel imaging can be used in minimum-pitch imaging.

DETAILED DESCRIPTION OF THE INVENTION

This patent application describes techniques that enable imaging of a fraction of a pixel-image, using a new exposure technique that I call "sub-pixel voting" (SPV). The disclosed SPV technique allows enhancing the resolution of the prior art massively parallel maskless lithography system by a factor of 2, 3, an order of magnitude, or even greater.

Referring to FIG. 2, each square (e.g., 9 or 10) represents the image of one pixel on the substrate, i.e., it is the image of one micromirror (or FLC) element which is either in the "on" position (light reflected from it is reaching the substrate) or in the "off" position (light reflected from it is blocked from reaching the substrate). The challenge this invention undertakes is: how to produce an image that is smaller than that of one pixel. As described below, it is done by the technique of sub-pixel voting.

In our prior-art maskless lithography techniques, as already mentioned, the SLM frame information is changed at a certain frame rate (from a few hundred Hz to >1 kHz) as the stage scans. Typically, the stage scan speed is such that during the interval that the SLM switches from one frame to the next (on the order of a msec) the distance that the stage moves is a small fraction of the size of an imaged pixel. Thus, at each point on the substrate, exposure is received from a large number of pulses (typically several tens) from the same mirror element. The photoresist has a threshold which can be related to number of laser pulses for full removal. Let us say this number is N.

The new technique for achieving image feature sizes smaller than a pixel works as follows:

For light reaching the substrate from a given mirror element the stage is kept at a fixed position for N/2 pulses, delivering half of the dose required for optimum (i.e., full-resist-removal) exposure. Then the stage is moved a distance equal to:

$$\tfrac{1}{2}R = \tfrac{1}{2} d_p / M_r,$$

where $d_p$ is the pixel size and $M_r$ is the reduction ratio of the projection lens. For example, if N=40 pulses,
$d_p$=12 μm, and
$M_r$=100, then, after exposure with 40/2=20 pulses, the stage is moved by (½) (12/100) micron=60 nanometers.

This is illustrated in FIG. 3, which shows the actual size of one SLM element 11 and projection lens 12. After such a movement, exposure is made by an additional N/2 pulses. These two "half-exposed" pixels (14 and 15) overlap as shown in FIG. 3, producing a full exposure (the optimum exposure) in a region 16 whose size is equal to 0.5 pixel width, or 0.06 micron. In the non-overlapping half of each pixel, the exposure received is only 50% of the required dose. A photoresist exposed in this manner can be chemically processed to yield an image size of 0.5 pixel-width, thus effectively doubling the resolution of the lithography system in one dimension. The two-dimensional resolution is described later.

The resist exposure detail is illustrated in FIG. 4. When the resist-coated substrate is exposed in the manner described above and is developed, the developed resist profile will appear as shown in FIG. 4(b). Typically, the next step may be deposition of a metal layer, as shown in FIG. 4(c), followed by stripping of the resist, which, as shown in FIG. 4(d), results in a metal region of the size of 0.5 pixel width. FIG. 4 shows substrate 5 with composite exposures 17–21, exposure results 20a and 21a after developing, and metallization results 23–25 with sub-pixel metallization 25 remaining after resist stripping.

The result achieved in FIG. 3 is a sub-pixel image that is 0.5 pixel-width wide but 1 pixel-width long. To achieve an image that is the size of 0.5 pixel-width in both length and width, i.e., a sub-pixel of area ¼ the pixel area, the following procedure is carried out, as shown in FIG. 5. First, a longitudinal scan is carried out as before, except that the dose delivered at each stop position of the stage is provided by N/4=10 pulses. This produces a dose of 20 pulses in the overlap region 26a, which is 0.5 pixel-width wide. Now the stage is stepped in the lateral direction by a distance equal to 0.5 pixel-width, and another scan is carried out as before. These two scans overlap by 0.5 pixel width, producing a segmented exposure such that the region 26b, which has received 100% exposure (with 40 pulses) has a size of 0.5 pixel-width in length and 0.5 pixel-width in width, which is the desired result. Note that the exposure in the corner regions, 26c, of the composite is 25% of the full exposure.

This technique can be extended to enhance the resolution by more than a factor of 2 in each dimension. For example, a resolution-quadrupling procedure is shown in FIG. 6, where the resulting sub-pixel is ¹⁄₁₆ the area of the pixel as defined by the SLM pixel unit. Here, after a pixel image receives N/4 pulses, the stage is moved longitudinally by 0.75 pixel-width for the next exposure, producing a region 27a that is ¼ pixel-width wide and receives 50% of full exposure. Similarly, after one scan is completed, the stage is moved laterally by 0.75 pixel-width. The result is that the full 100% exposure is obtained in an image region 27b that is equivalent to 0.25 pixel-width in length and 0.25 pixel-width in width. Note that the exposure in the corner regions, 27c, of the composite is 25% of the full exposure. When such an exposed photoresist is developed, it becomes possible to get a profile 28 as shown in FIG. 7.

The above techniques can be extended, in principle, to even finer resolutions up to the limit of the sidewall profile of the photoresist and the thinnest walls it can support when the development step is carried out. In theory, if $R_e$ is the enhanced resolution, which is a factor of E finer than the normal resolution R given in Eq. (1), then:

$$R_e=(1/E)R=(1/E)(d_p/M_r) \qquad \text{Equation (2)}$$

To achieve the resolution $R_e$, the stage is moved between successive full-pixel exposures and between adjacent scans by a distance S equal to (1−1/E) times the normal resolution; thus S is given by:

$$S=(1-1/E)R=(1-1/E)(d_p/M_r) \qquad \text{Equation (3)}$$

For example, in resolution doubling, E=2, and S=0.5 $d_p/M_r$ whereas in resolution quadrupling, E=4, which gives S=0.75 $d_p/M_r$.

In all cases, to optimize the enhanced resolution thus achieved, a number of parameters in the photoresist exposure and development processes will need to be optimized, including resist thickness, exposure dose, development chemicals, development time and temperature, and pre- or post-exposure baking.

I now describe the effect of the sub-pixel voting technique on the achievable minimum pitch of the higher-resolution image features. In the example of FIG. 5, in which the resolution is doubled to 0.06 μm by overlapping four pixel images offset by 0.06 μm, the next such group of pixels can be placed no closer than 0.12+0.06 μm=0.18 μm. This is illustrated in FIG. 8, which shows pattern 29 placed adjacent to pattern 31, the two patterns being in close proximity at their interface 30, and shows that the minimum pitch in such a case is 0.18 μm. In the resolution quadrupling case, the minimum pitch is 0.21 μm, as shown in FIG. 9 by patterns 32 and 34 and interface 33, producing fully exposed sub-pixels 35 and 36. In general, the minimum pitch in the normal case (prior art) is given by:

$$p=2R=2d_p/M_r$$

In the new technique, the minimum pitch, $p_e$, is given by:

$$p_e=2R-R_e \qquad \text{Equation (4)}$$

Using Equations (1) and (2), Equation (4) can be written as:

$$p_e=2R-(1/E)R=(2-1/E)(d_p/M_r) \qquad \text{Equation (5)}$$

In an ideal situation in lithography, it is desirable to have a minimum pitch that is equal to twice the resolution. In the resolution-enhancing technique described in this invention, such a minimum pitch is not achieved. However, there are numerous applications of lithography where it is still desirable to be able to image very fine features that are spaced at a pitch that may be greater than twice the resolution.

Figure 10:
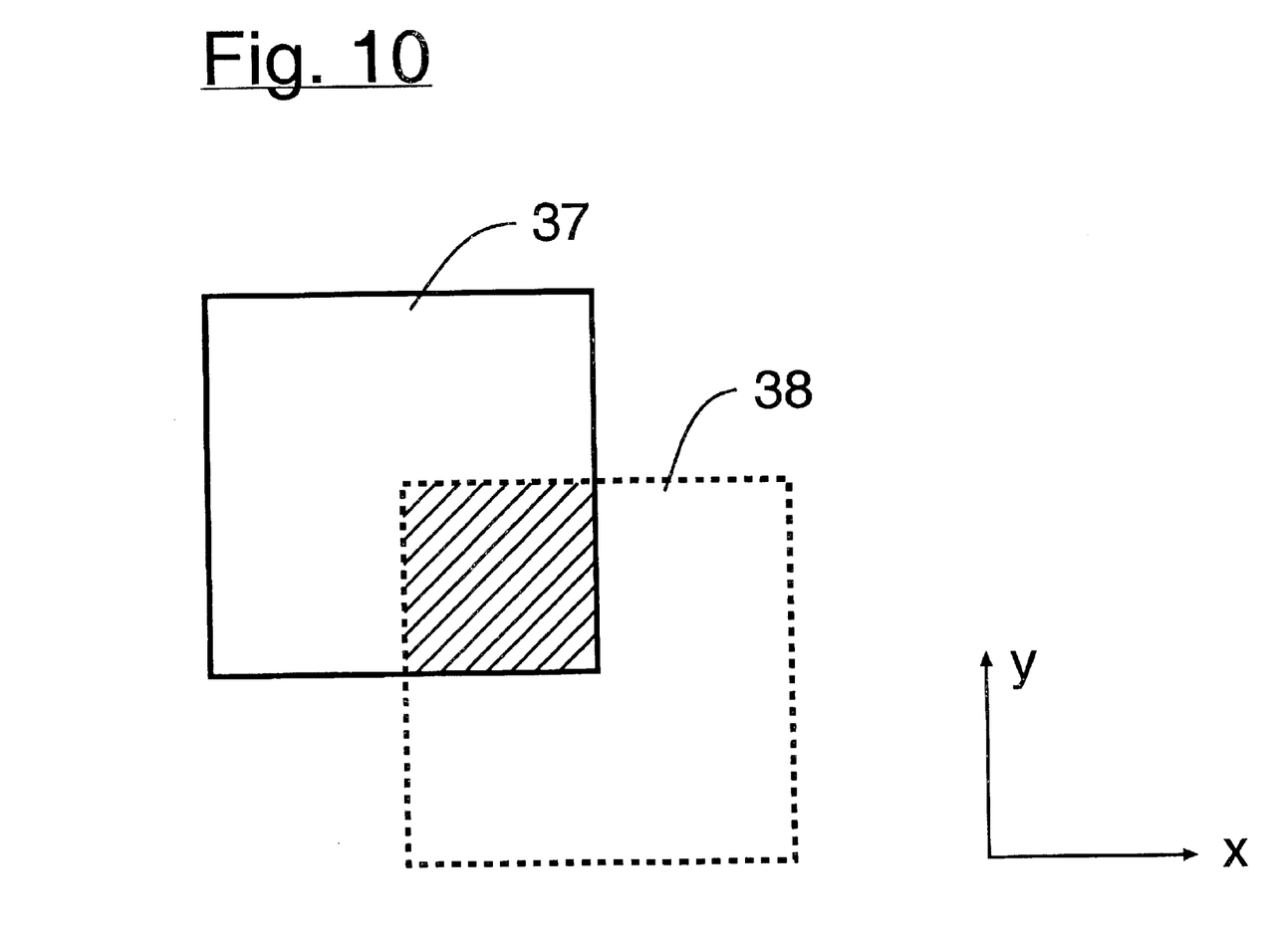
FIG. 10 is a diagram showing diagonally staggered half-exposed pixel overlaps for creating a ½×½ sub-pixel image area of full exposure.
Figure 11:
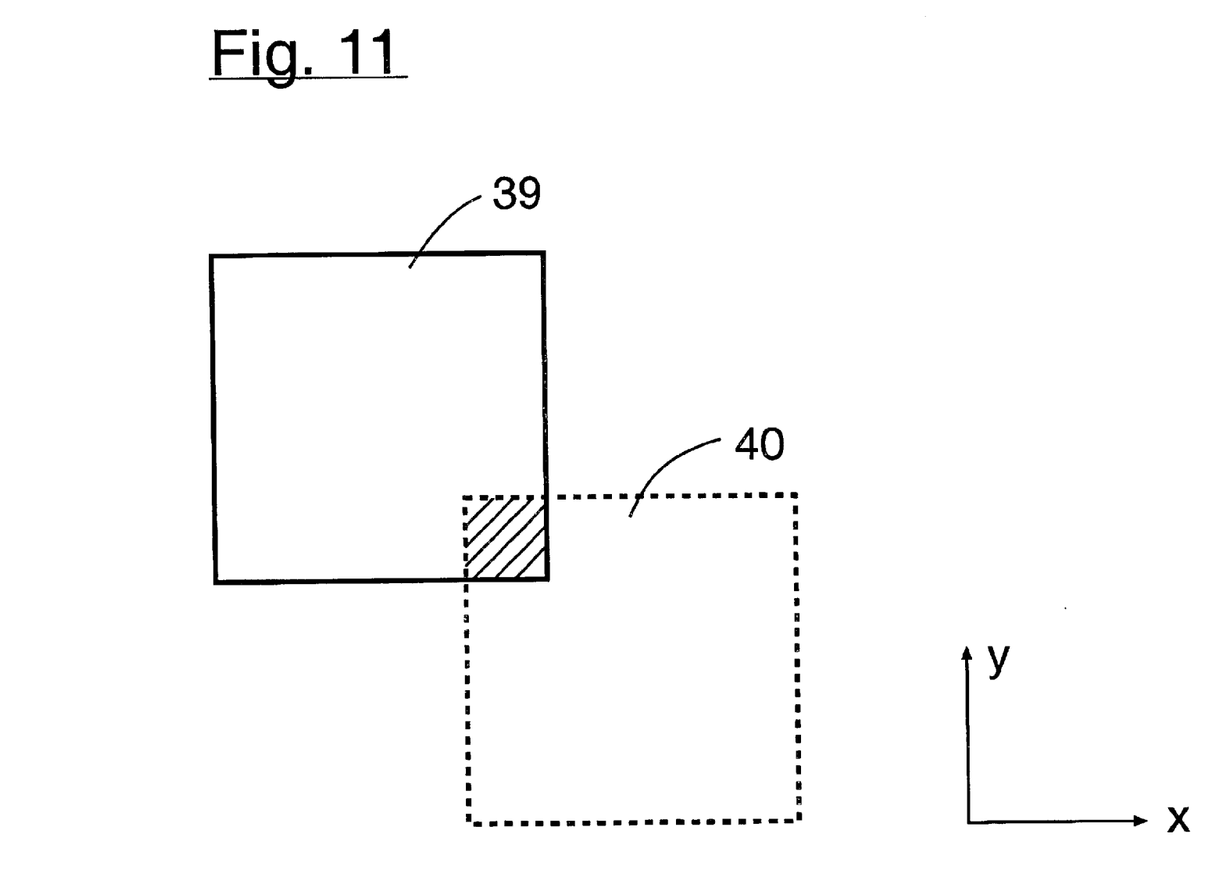
FIG. 11 is a diagram showing a diagonally staggered half-exposed pixel overlaps for creating a ¼×¼ sub-pixel image area of full exposure.
Figure 12:
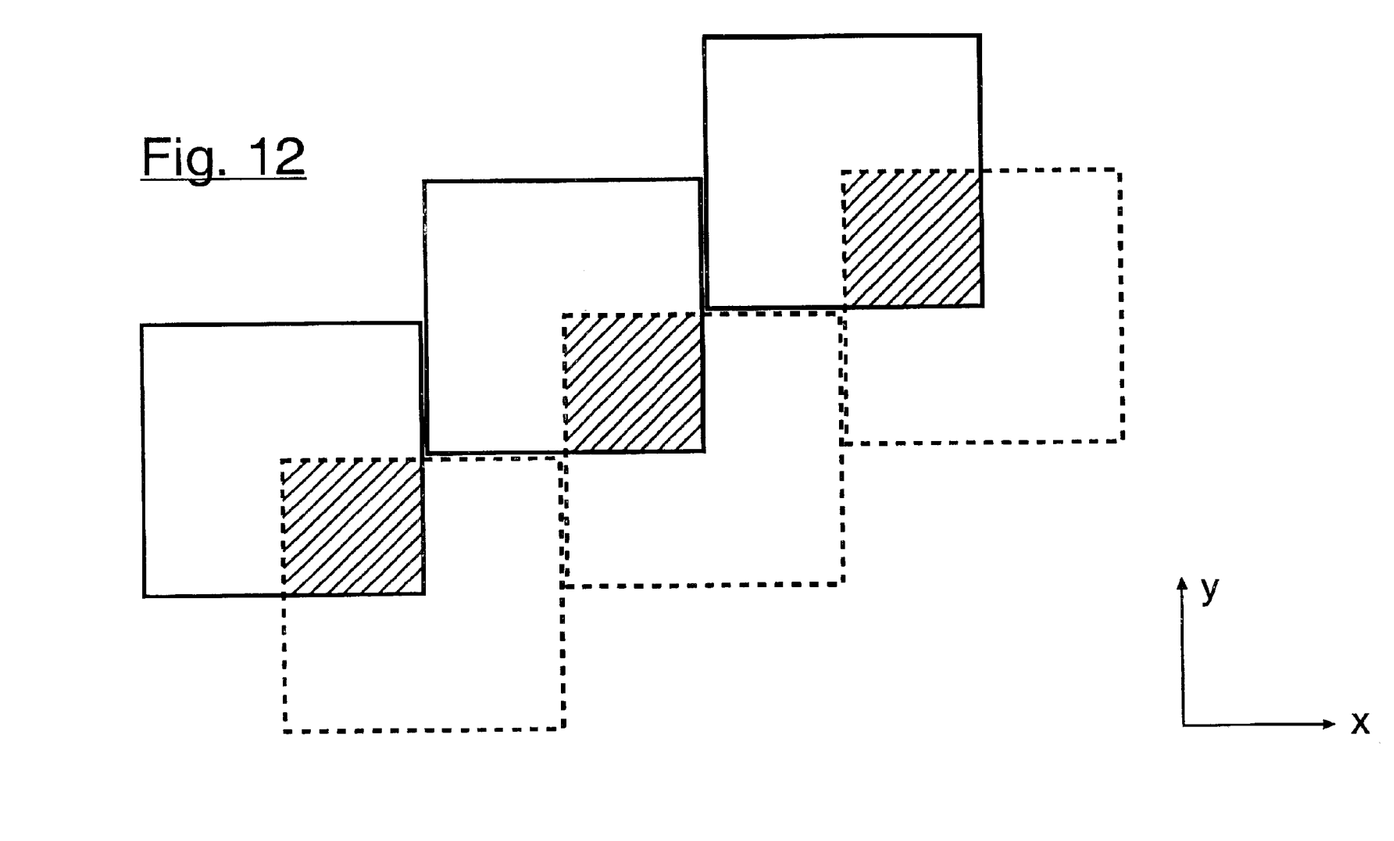
FIG. 12 is a diagram showing diagonally staggered pixel overlaps for creating a number of closely spaced ½×½ sub-pixels.
Figure 13:
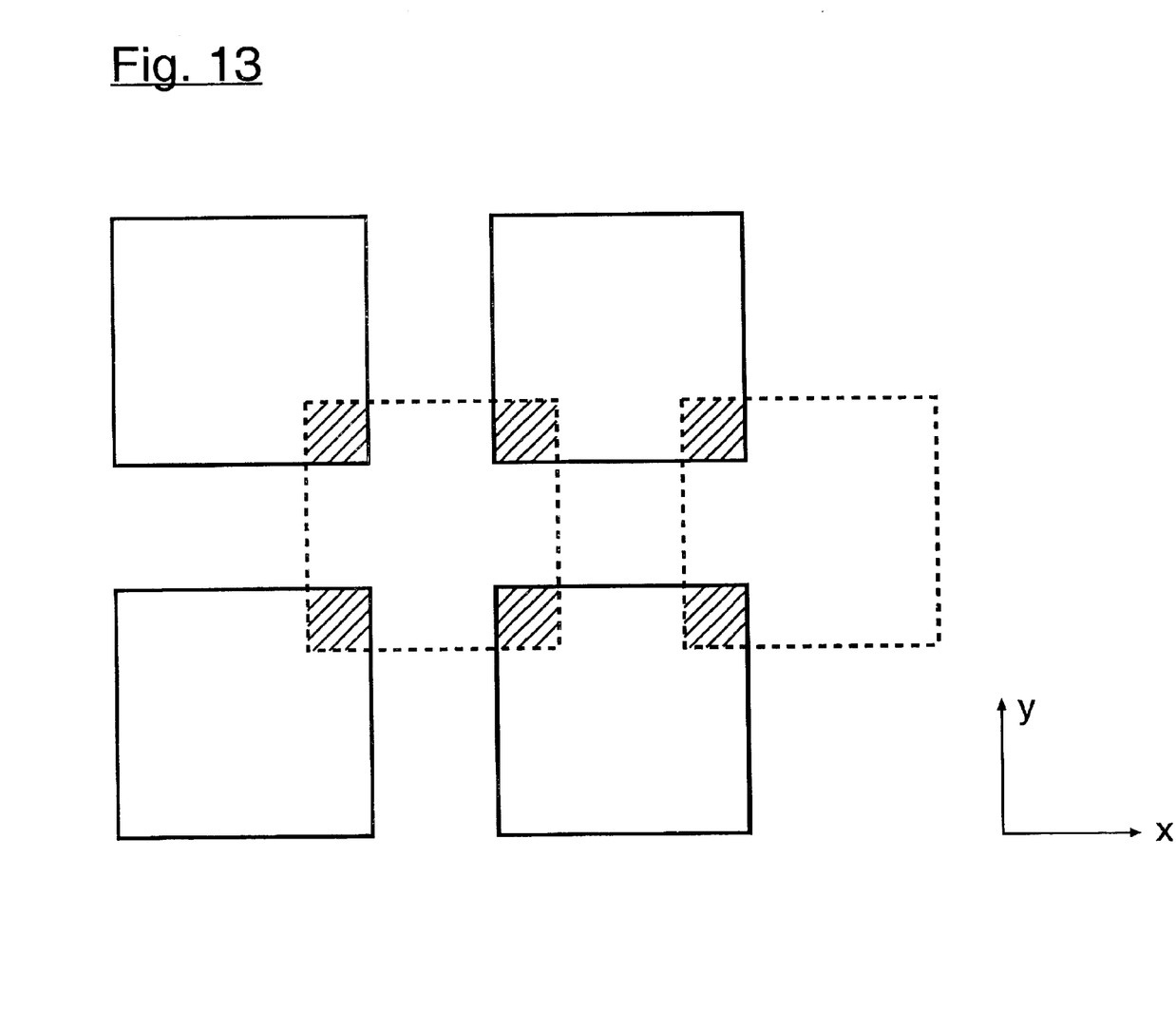
FIG. 13 is a diagram showing a denser scheme for pixel overlaps for creating a set of four ¼×¼ sub-pixels in a single pixel-area.

It is also possible to offset the single pixels both longitudinally and laterally. As shown in FIG. 10, the pixels 37 and 38 are offset from each other by 0.5 pixel size along x and y, producing a selected sub-pixel of 0.5-pixel size. The pixels 39 and 40 are offset by 0.75 pixel size along x and y, producing a selected sub-pixel of 0.25 pixel size.

There are several embodiments in which the pitch can be reduced to beyond the limits described above. For example, in the resolution-doubling case illustrated in FIG. 12, the 0.5-pixel-size sub-pixels can be imaged with a separation of 0.5 pixel but with an offset. As another example, illustrated in FIG. 13, which is a resolution-quadrupling embodiment, the selected 0.25 pixel-size sub-pixels can have a pitch of 0.75 pixel-size in both x and y.

It is evident that with the massive flexibility of software control of the SLM pixels, a vast number of pixel overlapping schemes can be realized. In fact, depending on the desired image pattern, the system computer may be programmed to determine all the required sets of partial exposures for each frame of the SLM and this process may be optimized to minimize the number of sets of partial exposures required.

In addition to the flexibility provided by the SLM, the laser pulses can also be fully controlled by the software. Since full exposure requires several tens of pulses, the controllability in the delivered dosage has a very fine granularity (equal to energy of one pulse). Thus, whereas in the preceding discussions I have used 100%, 50% and 25% exposures, the overlapping pixel-size exposures can be delivered in a gray scale of numerous levels. This will further enable the positioning and pitch of the selected sub-pixels to be more versatile.

Similarly, topographical patterning may be performed with at least some sub-pixel altitude resolution and a great deal of sub-pixel positional resolution. Arranging the pixel-selection device for different patterns on consecutive scans can increase the altitude resolution in positions where the altitude changes are less abrupt.

Method

The maskless lithographic method for providing sub-pixel resolution from components having unit-pixel resolution, is carried out in the following steps:

a) partially imaging in a first set of exposures on a unit-pixel basis with exposure values less than full exposure at both unselected sub-pixel locations and selected sub-pixel locations; and b) partially imaging in a subsequent set of exposures on a unit-pixel basis with exposure values less than full exposure at both unselected sub-pixel locations and selected sub-pixel locations during the subsequent set of exposures, with offset to said first set of exposures, in such fashion that selected sub-pixel locations receive cumulative exposure equal to full exposure as a composite of both said first set of exposures and said subsequent set of exposures.

What is claimed is:

1. A maskless lithographic system of sub-pixel resolution having a radiation source and an optical system with unit-pixel resolution pattern defining means between radiation source and a substrate mounted on a high-precision stage characterized by:

a) means to provide a first set of virtual-mask partial exposures on a unit-pixel basis; and b) means to provide at least one subsequent set of virtual-mask partial exposures on a unit-pixel basis, partially overlapping and offset from said first set;

whereby overlapping sub-pixel partial exposures form full exposures at sub-pixel areas, thus providing properly defined image areas of sub-pixel size.

2. A maskless lithographic system according to claim 1, in which the system mode is photoresist exposure with developing and subsequent processing for discrimination between partially and fully exposed sub-pixel-size regions.

3. A maskless lithographic system according to claim 1, in which the system mode is photoablation with selection of sub-pixel areas by discrimination between partially and fully exposed sub-pixel-size regions.

4. A maskless lithographic system according to claim 1, in which the system mode is photoablation for surface profiling.

5. A maskless lithographic system according to claim 1, in which the system mode is photoablation for via drilling.

6. A maskless lithographic system according to claim 1, in which the pattern defining means is a spatial light modulator with pixel-to-pixel selectivity.

7. A maskless lithographic system according to claim 6, in which the pattern defining means is a digital micromirror device.

8. A maskless lithographic system according to claim 6, in which the pattern defining means is a liquid crystal device.

9. A maskless lithographic system according to claim 8, in which the pattern defining means is a membrane mirror array.

10. A maskless lithographic system according to claim 6, in which the pattern defining means is a grating light valve.

11. A maskless lithographic system according to claim 1, further characterized by:

a) mean to supply description of the full image information to the system control computer;

b) software means to determine the sets of partial exposures necessary to achieve full exposure at the desired image location; and c) software means to optimize the sets of partial exposure so as to minimize their number.

12. A maskless lithographic method for providing sub-pixel resolution from components having unit-pixel resolution, in the following steps: a) partially imaging in a first set of exposures on a unit-pixel basis with exposure values less than full exposure at both unselected sub-pixel locations and selected sub-pixel locations; b) partially imaging at least one subsequent set of exposures on a unit-pixel basis with exposure values less than full exposure at both unselected sub-pixel locations and selected sub-pixel locations during the subsequent set of exposures, with offset to said first set of exposures, in such fashion that selected sub-pixel locations receive cumulative exposure equal to fill exposure as a composite of both said first set of exposures and said subsequent set of exposures; c) supplying a description of the full image information to the system control computer; d) determining with software means all the sets of partial exposures necessary to achieve full exposure at the desired image locations; and e) optimizing with software means the sets of partial exposures so as to minimize their number.

* * * * *